(12) United States Patent
Tang et al.

(10) Patent No.: US 9,470,943 B2
(45) Date of Patent: Oct. 18, 2016

(54) ARRAY SUBSTRATE, DISPLAY PANEL AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Zhanfeng Tang, Beijing (CN); Liping Liu, Beijing (CN); Jing Li, Beijing (CN); Jian Wu, Beijing (CN); Yu Al, Beijing (CN)

(73) Assignees: BOE TECHNOLOGY GROUP CO., LTD., Beijing (CN); HEFEI XINSHENG OPTOELECTRONICS TECHNOLOGY CO., LTD, Hefei, Anhui (CN)

( * ) Notice: Subject to any disclaimer, the term of this patent is extended or adjusted under 35 U.S.C. 154(b) by 0 days.

(21) Appl. No.: 14/744,431

(22) Filed: Jun. 19, 2015

(65) Prior Publication Data

US 2016/0187750 A1 Jun. 30, 2016

(30) Foreign Application Priority Data

Dec. 25, 2014 (CN) .......................... 2014 1 0828139

(51) Int. Cl.
*G02F 1/136* (2006.01)
*G02F 1/1362* (2006.01)
*H01L 27/12* (2006.01)

(52) U.S. Cl.
CPC ... *G02F 1/136259* (2013.01); *G02F 1/136204* (2013.01); *G02F 1/136286* (2013.01); *H01L 27/124* (2013.01); *G02F 2001/136272* (2013.01)

(58) Field of Classification Search
CPC ................... G02F 1/136259; G02F 1/136204; G02F 1/136286; G02F 1/1368; H01L 27/124
See application file for complete search history.

(56) References Cited

U.S. PATENT DOCUMENTS

2015/0054165 A1* 2/2015 Won ...................... H01L 27/124
257/773

* cited by examiner

Primary Examiner — James Dudek
(74) Attorney, Agent, or Firm — Nath, Goldberg & Meyer; Joshua B. Goldberg; Christopher Thomas

(57) ABSTRACT

The present invention provides an array substrate, a display panel and a display device, which can be used for solving the problem of an existing array substrate that ESD occurs between a data line and a repair line to cause short-circuiting of the data line and the repair line so as to pull down the voltage of the data line. The array substrate includes a plurality of main signal lines, at least one main repair line arranged to be crossed with and insulated from the main signal lines at the peripheral area of the array substrate, and a redundant repair line, and the redundant repair line is arranged to be insulated from the main repair line; wherein the redundant repair line includes at least one redundant repair part, and the resistance of each redundant repair part is smaller than the resistance of each main repair line.

20 Claims, 1 Drawing Sheet

ARRAY SUBSTRATE, DISPLAY PANEL AND DISPLAY DEVICE

CROSS REFERENCE OF RELATED APPLICATION

The present application claims the priority of Chinese Application No. 201410828139.5, filed in State Intellectual Property Office of P.R. China on Dec. 25, 2014, the entire contents of which are herein incorporated by reference.

FIELD OF THE INVENTION

The present invention belongs to the field of display technology, and in particular relates to an array substrate, a display panel and a display device.

BACKGROUND OF THE INVENTION

In a manufacturing process of a thin film transistor liquid crystal display (Thin Film Transistor Liquid Crystal Display, referred to as TFT-LCD), a small size product usually uses a shorting bar (Shorting Bar) detection means in a liquid crystal cell test (Cell Test) process. As shown in FIG. 1, a common electrode line 4 and three shorting bars respectively corresponding to a red sub-pixel, a green sub-pixel and a blue sub-pixel (namely, a red data signal shorting bar 1, a green data signal shorting bar 2 and a blue data signal shorting bar 3) are formed on an array substrate, wherein each shorting bar is connected with a data line 5, 6, 7 connected with the corresponding sub-pixel (the red sub-pixel, the green sub-pixel and the blue sub-pixel). Voltages are respectively applied on the shorting bars to detect whether the data lines connected with the shorting bars are damaged.

In order to avoid the scrap of a display panel due to the damage to the data line, a repair line 8 arranged to cross the data line is further arranged on the peripheral area of the array substrate. However, for this configuration, when a data voltage is applied on the data line, electro-static discharge (Electro-Static discharge, referred to as ESD) is liable to occur at the crossing position (for example, the position 9 in FIG. 1) of the repair line 8 and the data line, to break down the data line and form a short circuit with the repair line 8, resulting in that the data voltage on the data line is pulled down (the voltage on the data line is typically positive, and the voltage on the repair line 8 is zero, i.e., no voltage exists). In addition, when the data line on the display panel is detected by means of the shorting bar detection means, the data line forming the short circuit with the repair line 8 is also connected with other data lines, therefore the repair line 8 also pulls down fewer voltage on these other data lines, that is to say, the difference between the voltage of the data line forming the short circuit with the repair line 8 and the down-pulled voltage of the other data lines is very small, such that the difference between the voltages of the short-circuited data line and a pixel electrode driven by the other data lines is small, the difference of liquid crystal deflection is not obvious, and the difference between displayed colors is not obvious neither, therefore this short circuit failure is unlikely to be detected.

The inventors have observed that at least the following problems exist in the prior art: a full contact (Full Contact) detection means is adopted at a module (Module) stage, at this stage the data line is not connected with other data lines, the repair line 8 can pull down the voltage of this data line, the voltage will result in that the liquid crystal deflection is different from that of a normal area, and the detection result shows two lines. At this time, the detected data line has a problem, if the problem is severe, the entire panel will be discarded, and even if the problem is mild, an additional repair process needs to be added.

SUMMARY OF THE INVENTION

The object of the present invention is to provide an array substrate, a display panel and a display device which are capable of overcoming the above problems of the existing array substrate and capable of avoiding short-circuiting of a data line and a repair line and data line voltage pull-down caused by ESD between the data line and the repair line.

The technical solution adopted by the present invention for solving the technical problem is an array substrate, comprising a plurality of main signal lines and at least one main repair line arranged to be crossed with and insulated from the main signal lines at the peripheral area of the array substrate, wherein at least one redundant repair line, arranged to be crossed with and insulated from the main signal lines, is further arranged at the peripheral area of the array substrate, and the redundant repair line is arranged to be insulated from the main repair line;

wherein, the redundant repair line includes at least one redundant repair part, and the resistance of each redundant repair part is smaller than the resistance of each main repair line.

The redundant repair line is added on the array substrate provided by the invention, the redundant repair line includes at least one redundant repair part, the resistance of the redundant repair part of a unit length is smaller than the resistance of the main repair line of the unit length. Assuming that an ESD occurrence area is located in the area where the redundant repair part and the main repair line are located, since the resistance of the redundant repair part here is smaller than the resistance of the repair line at the position, the ESD will occur at the crossing position of the data line and the redundant repair part, to break down an insulating layer at the crossing position of the two lines, such that the redundant repair part is in short circuit with the data line to release static electricity to avoid ESD between the data line and the main repair line, meanwhile since the resistance of the redundant repair part is smaller than the resistance of each main repair line, the voltage on the data line pulled down by the redundant repair part is greatly reduced than that pulled down on the main repair line, so that the display effect is not influenced during detection at a subsequent module (Module) stage, and the yield of the array substrate is greatly improved as a result.

Preferably, the redundant repair line includes a plurality of redundant repair parts arranged to be disconnected with each other, the redundant repair parts spread over all the main signal lines, and the disconnection position of any two adjacent redundant repair parts is arranged between two adjacent signal lines.

Further preferably, the array substrate includes two redundant repair lines, and all the repair lines are arranged between the two redundant repair lines.

Further preferably, the array substrate further includes two redundant signal lines arranged to be crossed with and insulated from the repair lines, and the two redundant signal lines and the two redundant repair lines surround the crossing positions of the repair lines and the signal lines.

Further preferably, the redundant signal lines and the signal lines are arranged on the same layer and are insulated with each other.

Preferably, the repair lines and the redundant repair lines are arranged on the same layer.

Preferably, the signal lines include data lines and/or gate lines.

Preferably, the two ends of each redundant repair part are kept not connected.

The technical solution used for solving the technical problem in the present invention is a display panel, including the above-mentioned array substrate.

The technical solution used for solving the technical problem in the present invention is a display device, including the above-mentioned display panel.

Wherein reference signs are as follows: 1. a red data signal shorting bar; 2. a green data signal shorting bar; 3. a blue data signal shorting bar; 4. a common electrode line; 5. a data line connected with a red sub-pixel; 6. a data line connected with a green sub-pixel; 7. a data line connected with a blue sub-pixel; 8. a main repair line; 9. an ESD occurrence position; 10. a redundant repair line; 11. a redundant repair part; 12. a redundant signal line.

DETAILED DESCRIPTION OF THE EMBODIMENTS

In order that those skilled in the art can better understand the technical solution of the present invention, a further detailed description of the present invention will be given below in combination with the accompanying drawings and the specific embodiments.

Embodiment 1

Figure 1:
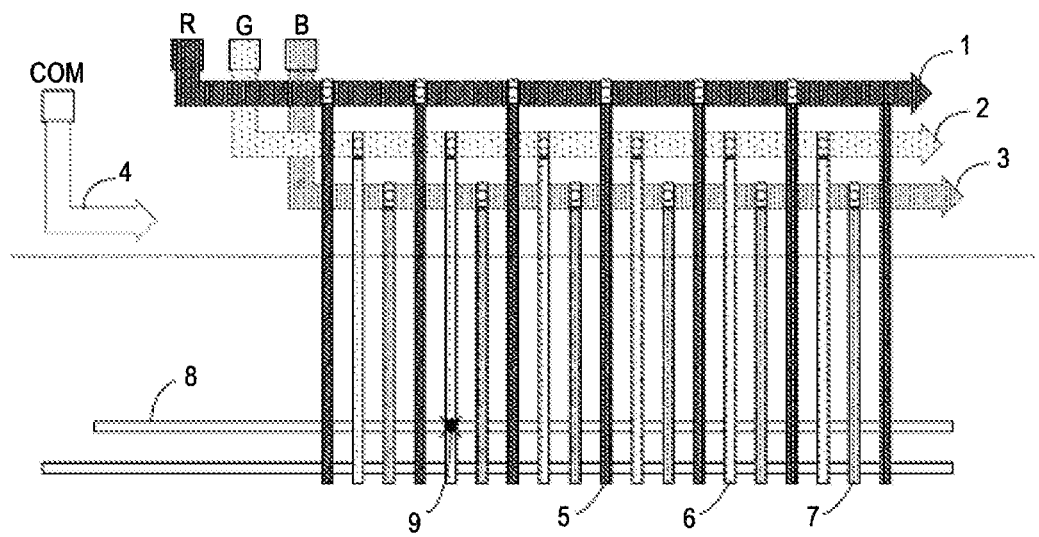
FIG. 1 is a schematic diagram of a peripheral area of an existing array substrate when performing detection using shorting bar detection means.
Figure 2:
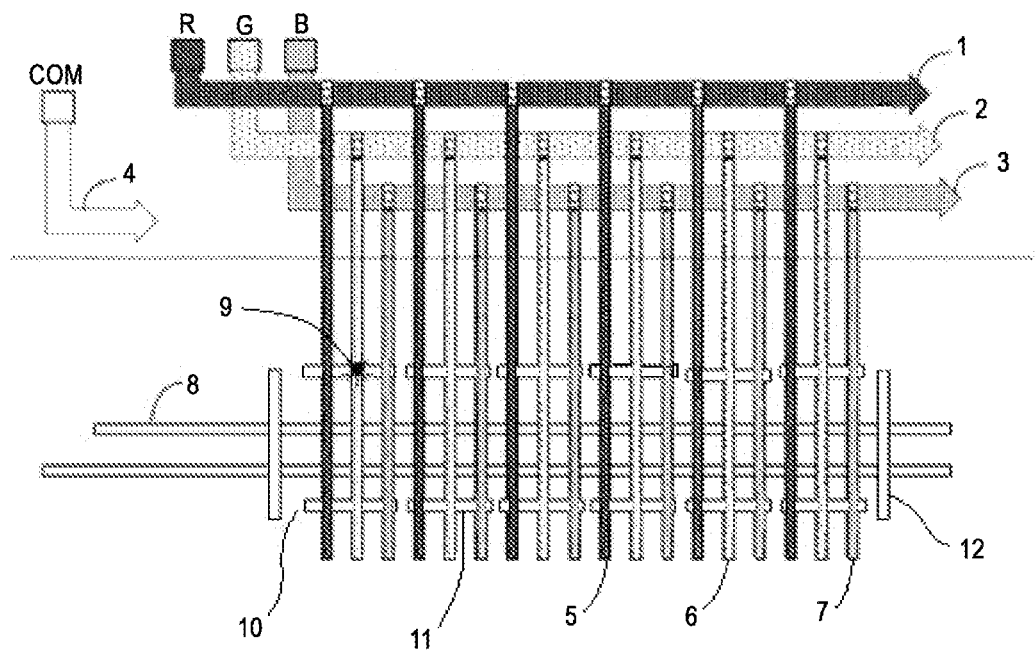
FIG. 2 is a schematic diagram of a peripheral area of an array substrate in an embodiment 1 of the present invention when performing detection using shorting bar detection means.

As shown in FIG. 2, the embodiment provides an array substrate, including a plurality of main signal lines, at least one main repair line 8 arranged to be crossed with and insulated from the main signal lines at the peripheral area of the array substrate, and at least one redundant repair line 10, and the redundant repair line 10 is arranged to be insulated from the main repair line 8; wherein the redundant repair line 10 includes at least one redundant repair part 11, and the resistance of the redundant repair part 11 of a unit length is smaller than the resistance of the main repair line 8 of the unit length.

Those skilled in the art can understand that, the array substrate generally includes a display area provided with a plurality of sub-pixels and a peripheral area surrounding the display area, in a preparation process of the array substrate, due to process reasons (for example, film formation, especially when a mother board is cut into a plurality of substrates, static electricity will be generated at the peripheral areas of the substrates), charge accumulation is liable to occur between the signal line and the repair line, and when the charge accumulation reaches a certain degree, electrostatic discharge (ESD) is caused, resulting in the breakdown of an insulating layer between the repair line and the signal line to cause short-circuiting of the repair line and the signal line, and this failure cannot be detected in failure detection using shorting bar, such that the repair line pulls down the voltage of the signal line in short circuit with the repair line during the detection at the subsequent module stage, resulting in poor display of a pixel unit corresponding to the signal line. While in the embodiment, since the redundant repair line 10 is added, the redundant repair line 10 includes at least one redundant repair part 11, and the resistance of each redundant repair part 11 is smaller than the resistance of the main repair line 8, when the charge accumulation reaches a certain degree, ESD is more liable to occur at the crossing position (the position 9 where ESD occurs in FIG. 2) of the main signal line and the redundant repair part 11, to break down the insulating layer at the crossing position of the two, such that the redundant repair part 11 is in short circuit with the main data line to release static electricity to avoid ESD between the main signal line and the main repair line 8. Meanwhile, since the resistance of the redundant repair part 11 is smaller than the resistance of each main repair line 8, compared with the main repair line 8, the voltage on the signal line pulled down by the redundant repair part 11 is greatly reduced, so that the display effect is not influenced during the detection at the subsequence module (Module) stage, and the yield of the array substrate is greatly improved as a result.

It should be noted that, as shown in FIG. 2, a data line 5 connected with a red sub-pixel, a data line 6 connected with a green sub-pixel and a data line 7 connected with a blue sub-pixel are the above-mentioned main signal lines, but the data lines as shown in FIG. 2 do not form limitation to the main signal lines in the embodiment, and the main signal lines in the embodiment can also be other connecting lines, such as gate lines or the like. Moreover, the extension direction of the redundant repair line 10 (the extension direction of the connected redundant repair parts 11) in FIG. 2 is the same as the direction of the main repair line 8. It should be understood that, due to this arrangement, the wiring is simple and the preparation is simple and convenient. Of course, it can be understood that, the extension direction of the redundant repair line 10 can also be not consistent with the extension direction of the main repair line 8 and can be an inclined direction, as long as it is ensured that each redundant repair part 11 is crossed with and insulated from the signal line. Meanwhile, in the embodiment, the width of the redundant repair line 10 can be arranged to be smaller than that of the main repair line 8, since the width of the redundant repair line 10 is smaller, no more space on the array substrate is occupied, and moreover, the redundant repair line 10 can also be made of a material different from that of the main repair line 8, as long as it is ensured that the resistance of each redundant repair part 11 is smaller than the resistance of the main repair line 8.

Preferably, the two ends of the redundant repair part 11 in the embodiment are kept not connected. At this time, in the case of ESD, when the redundant repair part 11 is in short circuit with the signal line, the redundant repair part 11 can be prevented from pulling down the voltage on the signal line. Of course, a voltage the same as or similar to the voltage on the signal line can also be applied on the redundant repair part 11 to avoid pulling down the voltage on the signal line as well.

Preferably, the redundant repair line 10 in the embodiment includes a plurality of redundant repair parts 11 arranged to be disconnected with each other, and the redundant repair parts spread over all the main signal lines, and the disconnection position of any two adjacent redundant repair parts 11 is arranged between two adjacent signal lines. This is because the ESD occurrence position 9 is random and is undetermined, at this time, the phenomenon can be better avoided that ESD occurs between the main repair line 8 and the signal line to break down the insulating layer therebetween to cause short circuit thereof.

Further preferably, the array substrate includes two redundant repair lines 10, and all the main repair lines 8 are arranged between the two redundant repair lines 10. That is, all the crossing positions of the signal lines and the main repair lines 8 are clamped between the two redundant repair lines 10, at this time, ESD between the main repair lines 8 and the signal lines can be better avoided, all the ESD occurrence positions are transferred to the crossing positions between the redundant repair lines 10 and the signal lines, and due to this arrangement, the wiring is simple, and the cost is saved at the same time.

Further preferably, the array substrate further includes two redundant signal lines 12 arranged to be crossed with and insulated from the main repair lines 8, and the two redundant signal lines 12 and the two redundant repair lines 10 surround the crossing positions of the main repair lines 8 and the main signal lines. For example, the shape defined by the redundant repair lines 10 and the redundant signal lines 12 is similar to a rectangle, so that all the crossing positions of the main signal lines and the main repair lines 8 can be well surrounded to avoid ESD between the main repair lines 8 and the main signal lines as much as possible. Wherein, the redundant signal lines 12 and the main signal lines are arranged on the same layer and insulated with each other, so that the time of a patterning process can be decreased to save the cost. Of course, the redundant signal lines 12 and the main signal lines can also be not arranged on the same layer, which can be implemented by performing nothing but one more patterning process.

Preferably, the main repair lines 8 and the redundant repair lines 10 are arranged on the same layer. At this time, the process time can be decreased to save the cost. Of course, the main repair lines 8 and the redundant repair lines 10 can also be not arranged on the same layer, but one more patterning process is needed.

Preferably, in the embodiment, the main signal lines are data lines and/or gate lines. It can be understood that, when the main signal lines are data lines, the redundant signal lines 12 are redundant data lines; when the main signal lines are gate lines, the redundant signal lines 12 are redundant gate lines; when the main signal lines are data lines and gate lines, the redundant signal lines 12 include redundant data lines and redundant gate lines.

It should be noted that, FIG. 2 is merely a schematic diagram only when performing failure detection using shorting bar on the data lines, wherein a common electrode line 4 and three shorting bars respectively corresponding to the red sub-pixel, the green sub-pixel and the blue sub-pixel (namely, a red data signal shorting bar 1, a green data signal shorting bar 2 and a blue data signal shorting bar 3) are formed on the array substrate, wherein each shorting bar is connected with the data line 5, 6, 7 connected with the corresponding sub-pixel (the red sub-pixel, the green sub-pixel and the blue sub-pixel). Voltages are respectively applied on the shorting bars to detect whether the data lines connected with the shorting bars are damaged. It can be understood that, the failure detection method using shorting bar can also be used for detecting the gate lines, and the detection principle is approximately the same as that of the data lines and will not be repeated.

Correspondingly, the embodiment further provides a display panel, including the above-mentioned array substrate, so that the yield of the display panel can also be improved.

Correspondingly, the embodiment further provides a display device, including above-mentioned display panel, so that the yield of the display device in the embodiment can be further improved.

The display device can be any product or component having a display function, for example, a mobile phone, a tablet computer, a television, a display, a notebook computer, a digital photo frame, a navigator and the like. Of course, the display device of the embodiment can also include other conventional structures, such as a display driving unit or the like.

It can be understood that, the above embodiments are merely exemplary embodiments adopted for describing the principle of the present invention, rather than limiting the present invention. Various variations and improvements can be made by those of ordinary skill in the art without departing from the spirit and essence of the present invention, and these variations and improvements are encompassed within the protection scope of the present invention.

The invention claimed is:

1. An array substrate, comprising a plurality of main signal lines and at least one main repair line arranged to be crossed with and insulated from the main signal lines at the peripheral area of the array substrate, wherein at least one redundant repair line, arranged to be crossed with and insulated from the main signal lines, is further arranged at the peripheral area of the array substrate, and the redundant repair line is arranged to be insulated from the main repair line; wherein, the redundant repair line comprises at least one redundant repair part, and the resistance of each redundant repair part is smaller than the resistance of each main repair line.

2. The array substrate of claim 1, wherein the redundant repair line comprises a plurality of redundant repair parts arranged to be disconnected with each other, and the redundant repair parts spread over all the main signal lines, and the disconnection position of any two adjacent redundant repair parts is arranged between two adjacent main signal lines.

3. The array substrate of claim 1, comprising two redundant repair lines, wherein the at least one main repair line is arranged between the two redundant repair lines.

4. The array substrate of claim 2, comprising two redundant repair lines, wherein the at least one main repair line is arranged between the two redundant repair lines.

5. The array substrate of claim 3, further comprising two redundant signal lines arranged to be crossed with and insulated from the main repair lines, wherein the two redundant signal lines and the two redundant repair lines surround the crossing positions of the at least one main repair line and the main signal lines.

6. The array substrate of claim 5, wherein the redundant signal lines and the main signal lines are arranged on the same layer and are insulated with each other.

7. The array substrate of claim 4, further comprising two redundant signal lines arranged to be crossed with and insulated from the main repair lines, wherein the two redundant signal lines and the two redundant repair lines surround the crossing positions of the at least one main repair line and the main signal lines.

8. The array substrate of claim 7, wherein the redundant signal lines and the main signal lines are arranged on the same layer and are insulated with each other.

9. The array substrate of claim 1, wherein the main repair lines and the redundant repair lines are arranged on the same layer.

10. The array substrate of claim 2, wherein the main repair lines and the redundant repair lines are arranged on the same layer.

11. The array substrate of claim 1, wherein the main signal lines comprise data lines and/or gate lines.

12. The array substrate of claim 2, wherein the main signal lines comprise data lines and/or gate lines.

13. The array substrate of claim 1, wherein the two ends of each redundant repair part are kept not connected.

14. The array substrate of claim 2, wherein the two ends of each redundant repair part are kept not connected.

15. A display panel, comprising an array substrate, wherein the array substrate comprises a plurality of main signal lines and at least one main repair line arranged to be crossed with and insulated from the main signal lines at the peripheral area of the array substrate, wherein at least one redundant repair line, arranged to be crossed with and insulated from the main signal lines, is further arranged at the peripheral area of the array substrate, and the redundant repair line is arranged to be insulated from the main repair line; wherein, the redundant repair line comprises at least one redundant repair part, and the resistance of each redundant repair part is smaller than the resistance of each main repair line.

16. The display panel of claim 15, wherein the redundant repair line comprises a plurality of redundant repair parts arranged to be disconnected with each other, and the redundant repair parts spread over all the main signal lines, and the disconnection position of any two adjacent redundant repair parts is arranged between two adjacent main signal lines.

17. The display panel of claim 15, wherein the array substrate comprises two redundant repair lines, and the at least one main repair line is arranged between the two redundant repair lines.

18. A display device, comprising a display panel, wherein the display panel comprises an array substrate, the array substrate comprises a plurality of main signal lines and at least one main repair line arranged to be crossed with and insulated from the main signal lines at the peripheral area of the array substrate, wherein at least one redundant repair line, arranged to be crossed with and insulated from the main signal lines, is further arranged at the peripheral area of the array substrate, and the redundant repair line is arranged to be insulated from the main repair line; wherein, the redundant repair line comprises at least one redundant repair part, and the resistance of each redundant repair part is smaller than the resistance of each main repair line.

19. The display device of claim 18, wherein the redundant repair line comprises a plurality of redundant repair parts arranged to be disconnected with each other, and the redundant repair parts spread over all the main signal lines, and the disconnection position of any two adjacent redundant repair parts is arranged between two adjacent main signal lines.

20. The display device of claim 18, wherein the array substrate comprises two redundant repair lines, and the at least one main repair line is arranged between the two redundant repair lines.

* * * * *